(12) United States Patent
Kanazawa

(10) Patent No.: US 10,109,515 B2
(45) Date of Patent: Oct. 23, 2018

(54) HAND UNIT AND TRANSFER METHOD

(71) Applicant: HIRATA CORPORATION, Kumamoto-shi, Kumamoto-ken (JP)

(72) Inventor: Keiji Kanazawa, Kumamoto (JP)

(73) Assignee: HIRATA CORPORATION, Kumamoto-Shi, Kumamoto-Ken (JP)

( * ) Notice: Subject to any disclaimer, the term of this patent is extended or adjusted under 35 U.S.C. 154(b) by 0 days.

(21) Appl. No.: 15/473,064

(22) Filed: Mar. 29, 2017

(65) Prior Publication Data
US 2017/0287759 A1 Oct. 5, 2017

(30) Foreign Application Priority Data

Mar. 31, 2016 (JP) .................................. 2016-071015

(51) Int. Cl.
| H01L 21/677 | (2006.01) |
| B25J 11/00 | (2006.01) |
| B25J 15/00 | (2006.01) |

(52) U.S. Cl.
CPC ..... *H01L 21/67706* (2013.01); *B25J 11/0095* (2013.01); *B25J 15/0014* (2013.01);
(Continued)

(58) Field of Classification Search
CPC ......... H01L 21/67706; H01L 21/67712; H01L 21/67742; H01L 21/68707; B25J 11/0095; B25J 15/0014; Y10S 901/30
(Continued)

(56) References Cited

U.S. PATENT DOCUMENTS

| 6,152,677 A | 11/2000 | Tateyama et al. |
| 6,837,672 B1 | 1/2005 | Tateyama et al. |

(Continued)

FOREIGN PATENT DOCUMENTS

| JP | H06-087531 A | 3/1994 |
| JP | H06-349933 A | 12/1994 |

(Continued)

OTHER PUBLICATIONS

Office Action dated Sep. 5, 2017, by the Taiwanese Patent Office in corresponding Taiwanese Patent Application No. 10620916280. (9 pages).

(Continued)

*Primary Examiner* — Stephen A Vu
(74) *Attorney, Agent, or Firm* — Buchanan Ingersoll & Rooney PC

(57) ABSTRACT

A hand unit of a robot arm includes a U-shaped placement portion on which a semiconductor wafer is placed. The hand unit includes, on one end side of the placement portion, a first support portion configured to support the semiconductor wafer at a first support height and a second support portion configured to support the semiconductor wafer at a second support height, and includes, on the other end side of the placement portion, a third support portion configured to support the semiconductor wafer at the first support height and a fourth support portion configured to support the semiconductor wafer at the second support height. The hand unit further includes a first driving unit configured to move the third support portion and/or the fourth support portion forward and backward with respect to the first support portion and the second support portion.

12 Claims, 8 Drawing Sheets

(52) U.S. Cl.
CPC .. *H01L 21/67712* (2013.01); *H01L 21/67742* (2013.01); *Y10S 901/30* (2013.01)

(58) Field of Classification Search
USPC ........................................................ 294/213
See application file for complete search history.

(56) References Cited

U.S. PATENT DOCUMENTS

| | | | |
|---|---|---|---|
| 6,962,477 B2 | 11/2005 | Tateyama et al. | |
| 8,454,068 B2* | 6/2013 | Hashimoto | B25J 15/00 294/103.1 |
| 8,720,965 B2* | 5/2014 | Hino | H01L 21/67742 294/103.1 |
| 8,764,085 B2 | 7/2014 | Urabe et al. | |
| 9,378,997 B2* | 6/2016 | Nishida | H01L 21/68728 |
| 9,425,076 B2* | 8/2016 | Agarwal | H01L 21/68707 |
| 2004/0113444 A1* | 6/2004 | Blonigan | H01L 21/68707 294/213 |
| 2012/0049555 A1* | 3/2012 | Fujii | H01L 21/67742 294/213 |

FOREIGN PATENT DOCUMENTS

| | | |
|---|---|---|
| JP | H11-031732 A | 2/1999 |
| JP | 2011-119347 A | 6/2011 |
| JP | 4976811 B2 | 7/2012 |
| JP | 2013-042175 A | 2/2013 |
| JP | 2014-086472 A | 5/2014 |
| JP | 5490860 B2 | 5/2014 |
| JP | 5698518 B2 | 4/2015 |
| TW | 201140730 A1 | 11/2011 |

OTHER PUBLICATIONS

Office Action (Notification of Reasons for Refusal) dated Oct. 6, 2017, by the Japanese Patent Office in corresponding Japanese Patent Application No. 2016-071015, and an English Translation of the Office Action. (6 pages).

* cited by examiner

FIG. 5
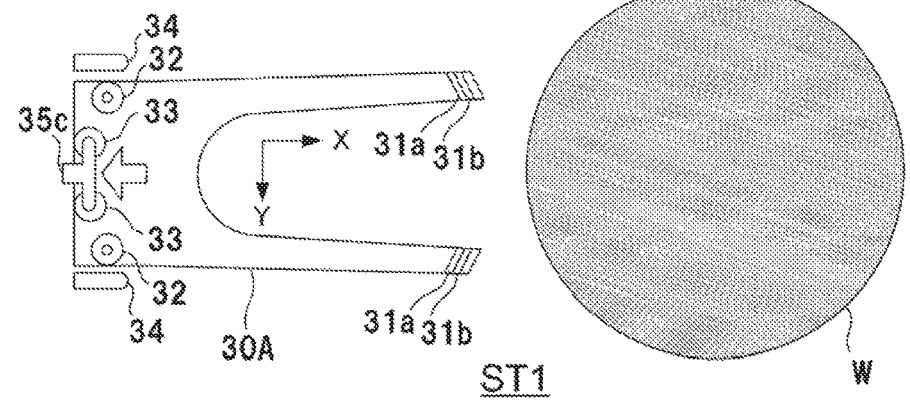
ST1
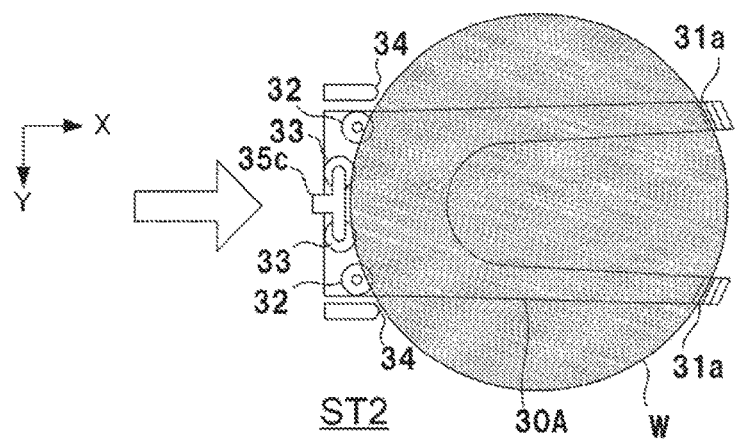
ST2
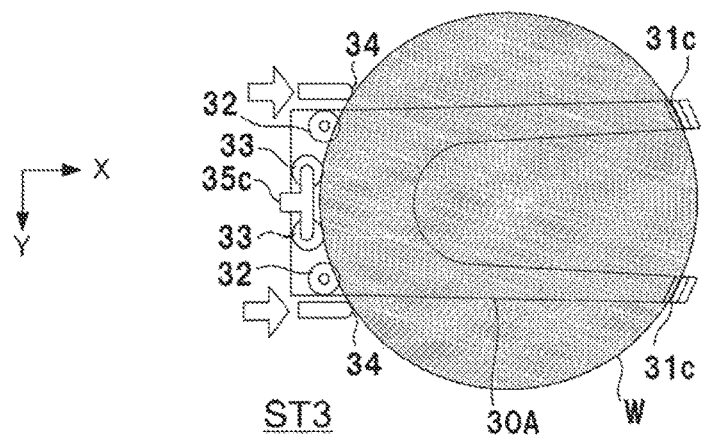
ST3

FIG. 7
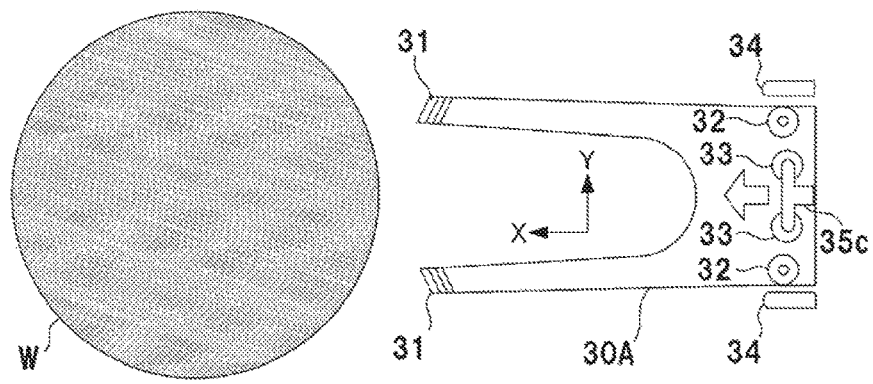
ST7
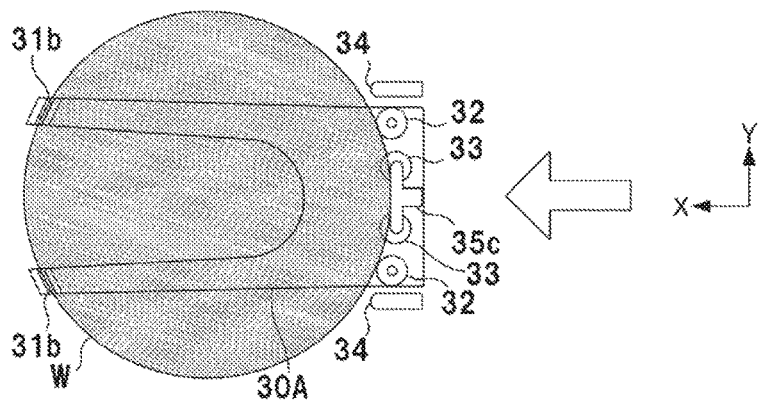
ST8
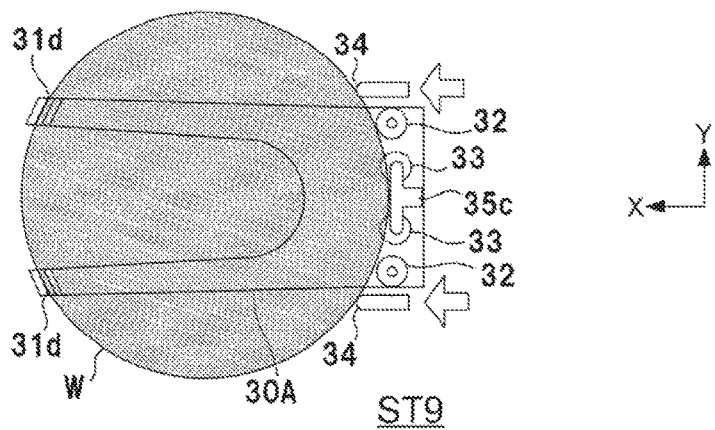
ST9

FIG. 8
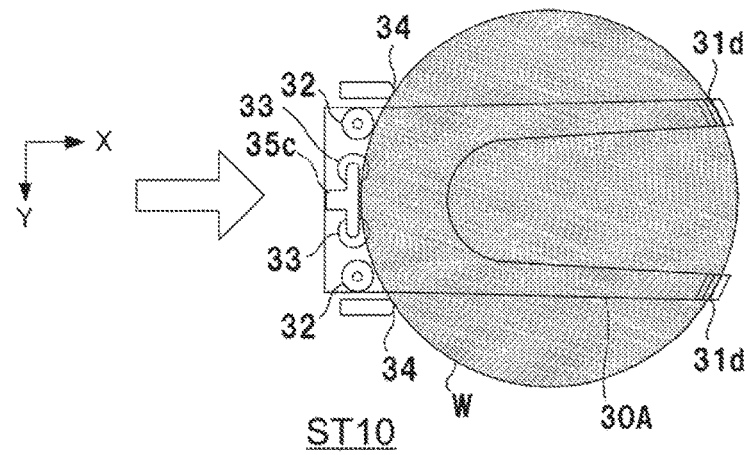
ST10
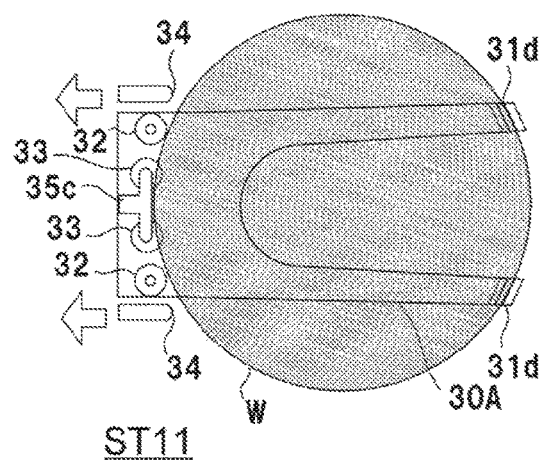
ST11
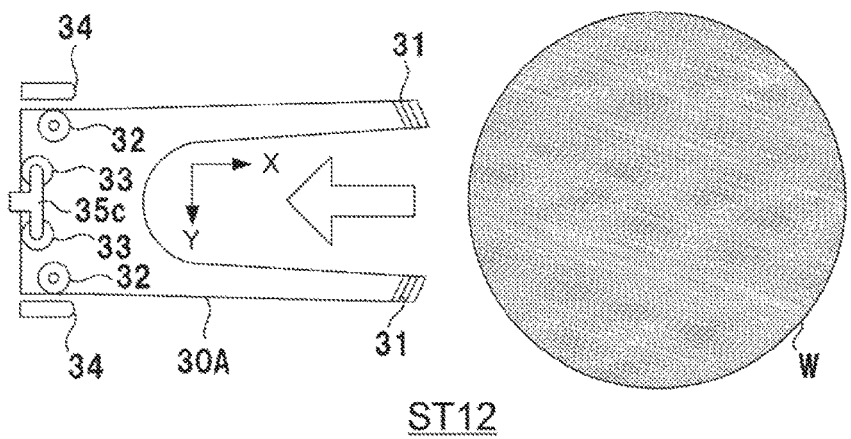
ST12

HAND UNIT AND TRANSFER METHOD

BACKGROUND OF THE INVENTION

Field of the Invention

The present invention relates to a hand unit of a robot arm for transferring a semiconductor wafer.

Description of the Related Art

In semiconductor manufacturing steps, a transfer apparatus is used to transfer a semiconductor wafer between apparatuses. The transfer apparatus includes a robot arm, and moves a semiconductor wafer while supporting it by a hand unit at the distal end of the robot arm. The process contents of the semiconductor wafer may influence the quality of the semiconductor wafer by using the same hand unit before and after a process. In, for example, a cleaning process, if the hand unit before the process supports the semiconductor wafer after the process, dust remaining in the hand unit adheres to the semiconductor wafer after the process.

As a measure against this problem, there is proposed a method of using a twin-arm transfer apparatus including two sets of robot arms and hand units and switching the hand unit supporting the semiconductor wafer before and after the process. In this method, however, the structure and operation control of the transfer apparatus are complicated and the cost unavoidably increases. To solve this problem, there is proposed a hand unit which makes it possible to change the support position of a semiconductor wafer with one hand unit.

Japanese Patent No. 4976811 discloses a fork support provided with two support portions on which a semiconductor wafer is inclined and placed. Japanese Patent No. 5698518 discloses an end effector which changes the support portion of a semiconductor wafer by rotating a substrate holding member. Japanese Patent No. 5490860 discloses a hand which changes the support portion of a semiconductor wafer by opening/closing a pair of hand elements. The arrangement for changing the support position of the semiconductor wafer, which is disclosed in Japanese Patent No. 4976811, may be formed more simply than those disclosed in Japanese Patent Nos. 5698518 and 5490860.

In general, however, a semiconductor wafer is transferred in a horizontal orientation. If a semiconductor wafer is inclined and supported as described in Japanese Patent No. 4976811, the semiconductor wafer falls from the inclined state to the horizontal orientation when transferred to an apparatus. Then, particles adhering to the placement table of the apparatus may curl up to adhere to the semiconductor wafer.

SUMMARY OF THE INVENTION

The present invention enables changing of the support position of a semiconductor wafer before and after a process by one hand unit.

The present invention provides a hand unit of a robot arm including a U-shaped placement portion on which a semiconductor wafer is placed, comprising: a first support portion and a second support portion on one end side of the placement portion, the first support portion being configured to support the semiconductor wafer at a first support height, and the second support portion being configured to support the semiconductor wafer at a second support height; and a third support portion and a fourth support portion on the other end side of the placement portion, the third support portion being configured to support the semiconductor wafer at the first support height, and the fourth support portion being configured to support the semiconductor wafer at the second support height, wherein the hand unit further comprises a first driving unit configured to move the third support portion and/or the fourth support portion forward and backward with respect to the first support portion and the second support portion.

The present invention also provides a hand unit of a robot arm for transferring a semiconductor wafer, comprising: a plate-like U-shaped hand member; a first support member provided on a distal end side of the hand member; a second support member provided on a root side of the hand member; a third support member provided on the root side of the hand member; and a first driving unit, the first support member including a first support portion configured to support the semiconductor wafer at a first support height from a surface of the hand member, and a second support portion configured to support the semiconductor wafer at a second support height from the surface, the second support member including a third support portion configured to support the semiconductor wafer at the first support height from the surface, and the third support member including a fourth support portion configured to support the semiconductor wafer at the second support height from the surface, wherein the first driving unit moves the second support member and/or the third support member forward and backward with respect to the first support member.

The present invention further provides a transfer method of transferring a semiconductor wafer by a hand unit of a robot arm including a U-shaped placement portion on which the semiconductor wafer is placed, the hand unit including a first support portion and a second support portion which are arranged on one end side of the placement portion, the first support portion being configured to support the semiconductor wafer at a first support height, and the second support portion being configured to support the semiconductor wafer at a second support height, and a third support portion and a fourth support portion each arranged on the other end side of the placement portion and configured to support the semiconductor wafer, the method comprising: a first transferring step of transferring the semiconductor wafer before a process; and a second transferring step of transferring the semiconductor wafer after the process, the first transferring step including a first moving step of moving one of the third support portion or the fourth support portion, and a first supporting step of supporting the semiconductor wafer at the first support height by the first support portion and the other one of the third support portion or the fourth support portion, the second transferring step including a second moving step of moving the one of the third support portion or the fourth support portion, and a second supporting step of supporting the semiconductor wafer at the second support height by the second support portion and the one of the third support portion or the fourth support portion.

The present invention further provides a transfer method of transferring a semiconductor wafer by a hand unit of a robot arm including a U-shaped placement portion on which the semiconductor wafer is placed, the hand unit including a first support portion and a second support portion which are arranged on one end side of the placement portion, the first support portion being configured to support the semiconductor wafer at a first support height, and the second support portion being configured to support the semiconductor wafer at a second support height, and a third support portion and a fourth support portion each arranged on the other end side of the placement portion and configured to support the semiconductor wafer, the method comprising: a first transferring step of transferring the semiconductor wafer before a process; and a second transferring step of transferring the semiconductor wafer after the process, the first transferring step including a first arrangement change step of changing relative arrangement of the third support portion and the fourth support portion, and a first supporting step of supporting the semiconductor wafer at the first support height by the first support portion and the third support portion, the second transferring step including a second arrangement change step of changing relative arrangement of the third support portion and the fourth support portion, and a second supporting step of supporting the semiconductor wafer at the second support height by the second support portion and the fourth support portion.

Further features of the present invention will become apparent from the following description of exemplary embodiments (with reference to the attached drawings).

BRIEF DESCRIPTION OF THE DRAWINGS

FIG. 5 is a view showing an example of a transfer operation;

FIG. 7 is a view showing the example of the transfer operation; and

FIG. 8 is a view showing the example of the transfer operation.

DESCRIPTION OF THE EMBODIMENTS

A hand according to an embodiment of the present invention will be described with reference to the accompanying drawings. Note that in each drawing, arrows X and Y indicate horizontal directions perpendicular to each other, and an arrow Z indicates the vertical direction (the vertical direction perpendicular to the X-Y plane).

<Overview of Transfer Apparatus>

Figure 1:
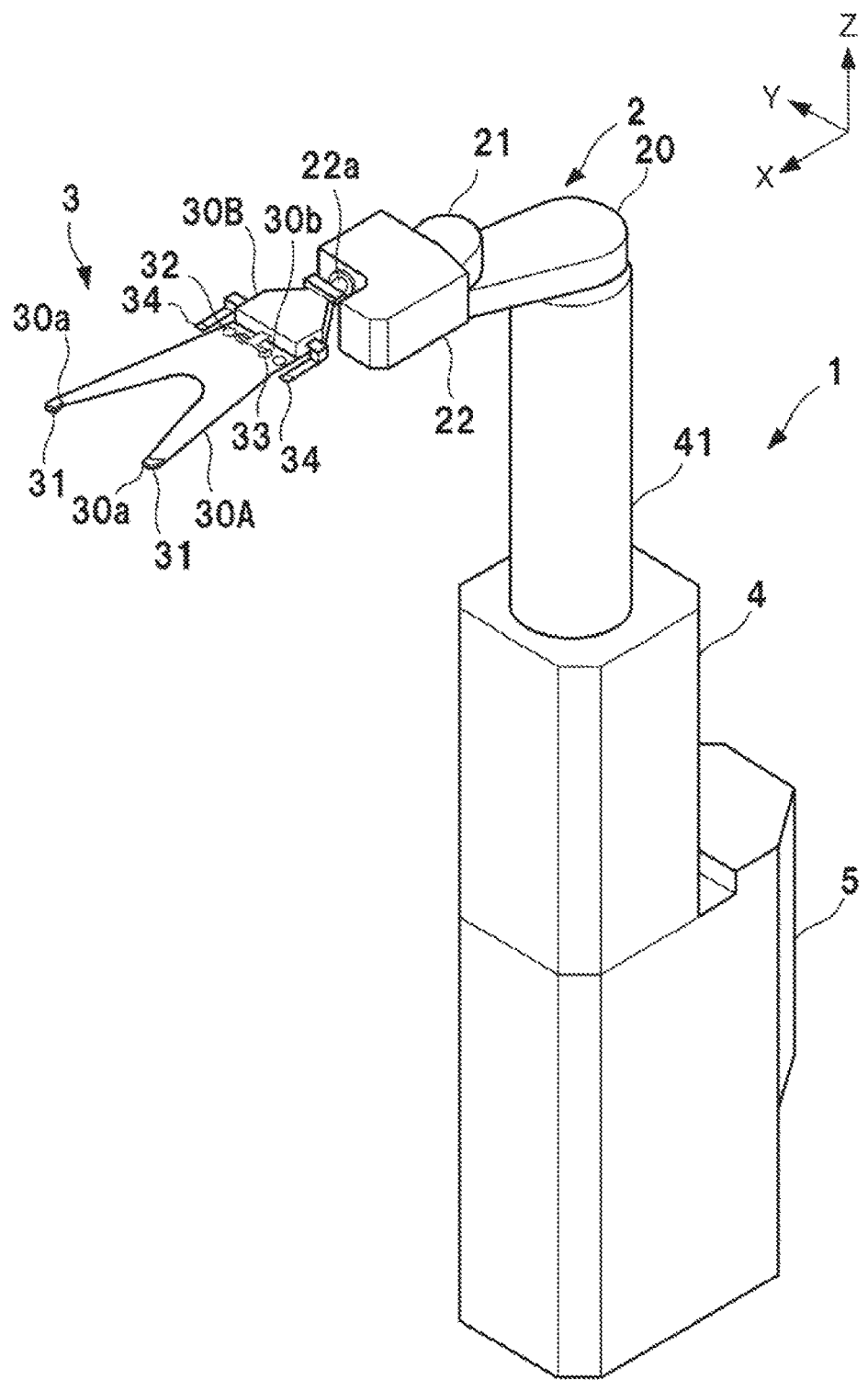
FIG. 1 is a perspective view showing a transfer apparatus.

FIG. 1 is a perspective view showing a transfer apparatus 1 using a hand unit 3 according to an embodiment of the present invention. The transfer apparatus 1 is an apparatus for transferring, for example, a semiconductor wafer between a cassette and a processing apparatus. The transfer apparatus 1 includes a robot arm 2, an elevating unit 4 for moving up and down the robot arm 2, and a traveling unit 5 for moving the overall elevating unit 4 along a traveling axis.

The traveling unit 5 includes, for example, a mechanism that moves on a rail (not shown) between the arrangement position of the cassette and the processing apparatus. The elevating unit 4 includes an elevating shaft 41 extending in the Z-axis direction, and has a mechanism for moving the elevating shaft 41 in the Z-axis direction. The robot arm 2 is mounted on the elevating shaft 41, and the elevating unit 4 moves up and down the robot arm 2 and the hand unit 3.

The robot arm 2 includes arm portions 20 and 21 and a support unit 22. The arm portions 20 and 21 are connected to each other to be pivotable about a rotation axis parallel to the Z-axis. An end portion of the arm portion 20 is connected to the upper portion of the elevating shaft 41 to be pivotable about the Z-axis. The pivot of the arm portion 20 (upper arm) about the elevating shaft 41 and the pivot of the arm portion 21 (forearm) about the arm portion 20 cause the robot arm 2 to stretch/contract and turn within the horizontal plane. The support unit 22 is provided in the end portion of the arm portion 21 on the distal end side, and the hand unit 3 is supported by the support unit 22. The support unit 22 includes a horizontal rotation shaft 22a extending in the horizontal direction, and the hand unit 3 is supported by this horizontal rotation shaft 22a. The support unit 22 includes a mechanism for rotating the horizontal rotation shaft 22a, and the hand unit 3 can be reversed (turned upside down) by the rotation of the horizontal rotation shaft 22a.

With the above arrangement, the hand unit 3 can move forward and backward in an arbitrary horizontal direction at an arbitrary height, and can be reversed.

<Hand Unit>

Figure 2:
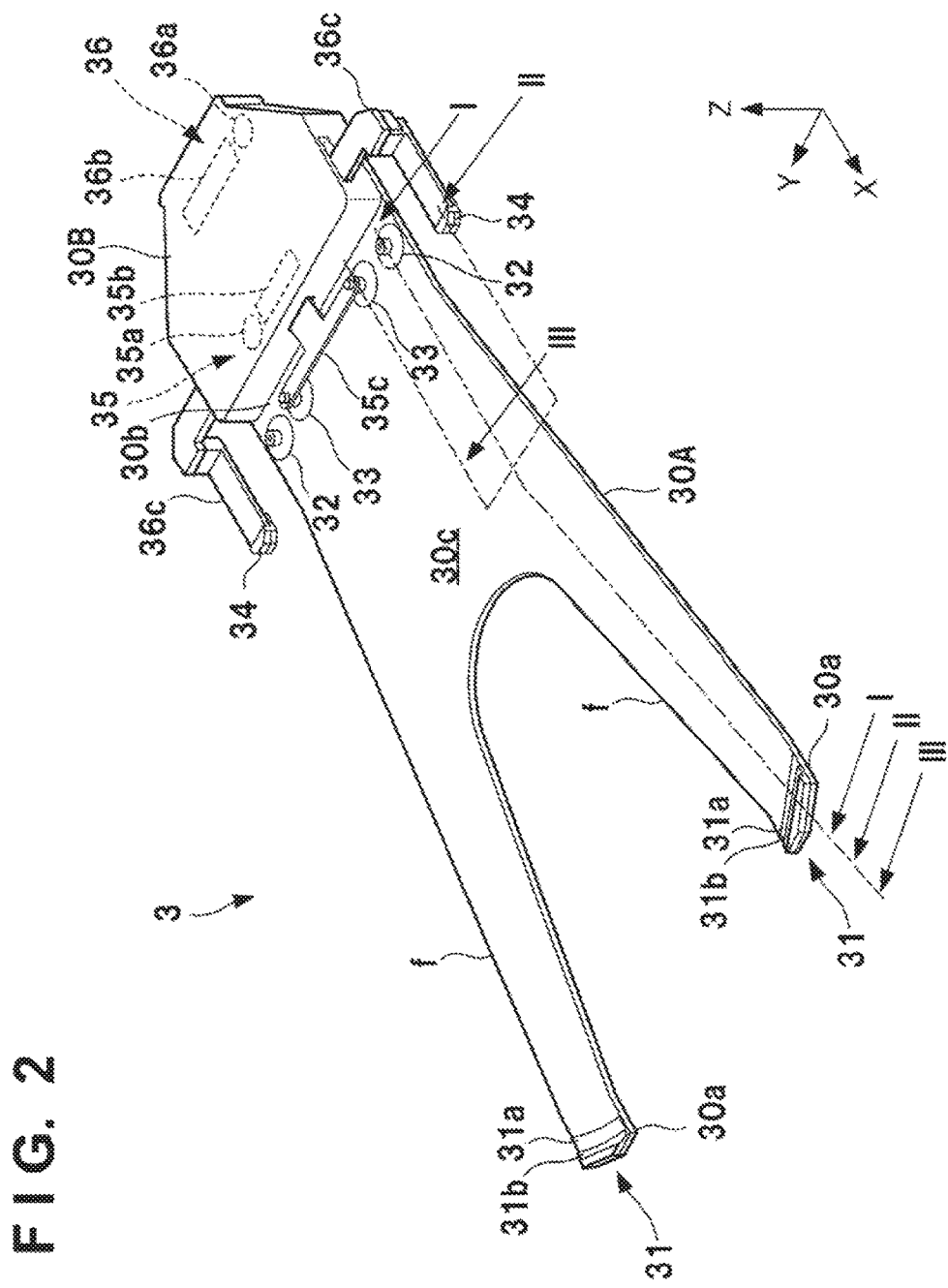
FIG. 2 is a perspective view showing a hand unit according to an embodiment of the present invention.

The hand unit 3 will be described with reference to FIG. 2. FIG. 2 is a perspective view showing the hand unit 3. Although the operation of the robot arm 2 variously changes the orientation of the hand unit 3, the arrangement of the hand unit 3 in a state in which the longitudinal direction (distal end-front direction) of the hand unit 3 indicates, the X direction, and the width direction of the hand unit 3 indicates the Y direction will be described for the sake of descriptive convenience.

The hand unit 3 includes a hand member 30A and a base unit 30B. The hand member 30A is a plate-like member on which a semiconductor wafer is placed, and the side of a surface 30c of the hand member 30A forms a placement portion on which a semiconductor wafer is placed. Note that in this embodiment, a semiconductor wafer is not placed directly on the surface 30c of the hand member 30A but placed on support members 31 to 33 (to be described later). The surface 30c of the hand member 30A is maintained in the horizontal orientation with respect to the X-Y plane but the hand member 30A can be reversed by the support unit 22 described above.

The hand member 30A includes a pair of finger portions f extending in the form of a fork in the X direction, and is formed into a U shape as a whole. One end portion of the hand member 30A in the longitudinal direction corresponds to distal end portions 30a of the respective finger portions f, and the other end portion corresponds to a root portion 30b which bundles the finger portions f. The root portion 30b of the hand member 30A is supported by the base unit 30B.

The support members 31 to 33 for supporting the semiconductor wafer are provided on the side of the surface 30c of the hand member 30A. The support members 31 to 33 are relatively arranged so that the support members 31 are located on the sides of the distal end portions 30a and the support members 32 and 33 are located on the side of the root portion 30b. In this embodiment, the support member 31 is provided in each distal end portion 30a. The number of support members 31 may be one, or three or more. The position of each support member 31 may be the distal end position of the corresponding distal end portion 30a or a position away from the distal end position to the root portion 30b.

The two support members 32 are provided while being spaced apart from each other in the Y direction. The number of support members 32 may be one, or three or more. The two support members 33 are provided while being spaced apart from each other in the Y direction. The number of support members 33 may be one, or three or more, in this embodiment, the two support members 33 are located between the two support members 32 when viewed in the Y direction. However, the arrangement of the support members 32 and 33 is not limited to this. For example, the two support members 32 may be located between the two support members 33. Alternatively, the support members 32 and 33 may be alternately arranged in the Y direction.

In this embodiment, the support members 32 are fixed to the hand member 30A, and the support members 33 are arranged to be movable on the hand member 30A. However, the support members 32 may be arranged to be movable and the support members 33 may be fixed. Alternatively, the support members 32 and 33 may be arranged to be movable. In this embodiment, the support members 33 are movable in the X direction, and can move forward and backward with respect to the support members 31. The movement of the support member 33 toward the support member 31 in the X direction may be referred to as forward movement or advancement, and the movement of the support member 33 from the side of the support member 31 to the side of the root portion 30b (base unit 30B) may be referred to as backward movement or retraction.

The base unit 30B is a portion connected to the robot arm 2. The base unit 30B incorporates driving units 35 and 36. The driving unit 35 is a unit for moving the support members 33 forward and backward with respect to the support members 31. In this embodiment, the driving unit 35 includes a driving source 35a, a transmission mechanism 35b, and a support member (moved member) 35c. The driving source 35a is, for example, a motor. The transmission mechanism 35b transmits the driving force of the driving source 35a to the support member 35c while converting the driving force into reciprocation of the support member 35c. The transmission mechanism 35b is, for example, a ball screw mechanism or a rack and pinion mechanism. The support member 35c is formed into a T shape, and its one end portion (proximal end portion) is connected to the transmission mechanism 35b and the branch portions of the other end portion (distal end portion) are respectively fixed to the support members 33.

The driving unit 36 is a unit for moving holding members 34 forward and backward with respect to the support members 31. The holding members 34 are members which are arranged on the side of the root portion 30b and hold the semiconductor wafer together with the support members 31. In this embodiment, the two holding members 34 are provided while being spaced apart from each other in the Y direction. The number of holding members 34 may be one, or three or more. In this embodiment, the support members 32 and 33 are located between the two holding members 34 when viewed in the Y direction. However, the positions of the holding members 34 are not limited to them. For example, the holding members 34 can be arranged, in the central portion of the root portion 30b in the Y direction or the like.

In this embodiment, the driving unit 36 includes a driving source 36a, a transmission mechanism 36c, and a pair of support members 36c. The driving source 36a is, for example, a motor. The transmission mechanism 36b transmits the driving force of the driving source 36a to each support member 36c while converting the driving force into the reciprocation of each support member 36c. The transmission mechanism 36b is, for example, a ball screw mechanism or a rack and pinion mechanism. Each support member 36c is formed into a T shape, and includes a projecting portion (arm) at the distal end of the branch portion. One end portion (proximal end portion) of each support member 36c is connected to the transmission mechanism 36b, and the holding members 34 are respectively fixed to the projecting portions of the support members 36c. The two holding members 34 are moved synchronously. Therefore, the pair of support members 36c may be an integrated member.

The support state and holding state of a semiconductor wafer will be described next. In this embodiment, to allow a change in support position of a semiconductor wafer, a combination of the support members 31 to 33 for supporting the semiconductor wafer can be switched. Examples of the combination of the support members 31 to 33 for supporting a semiconductor wafer are a combination of the support members 31 and 32 and a combination of the support members 31 and 33.

Figure 3A:
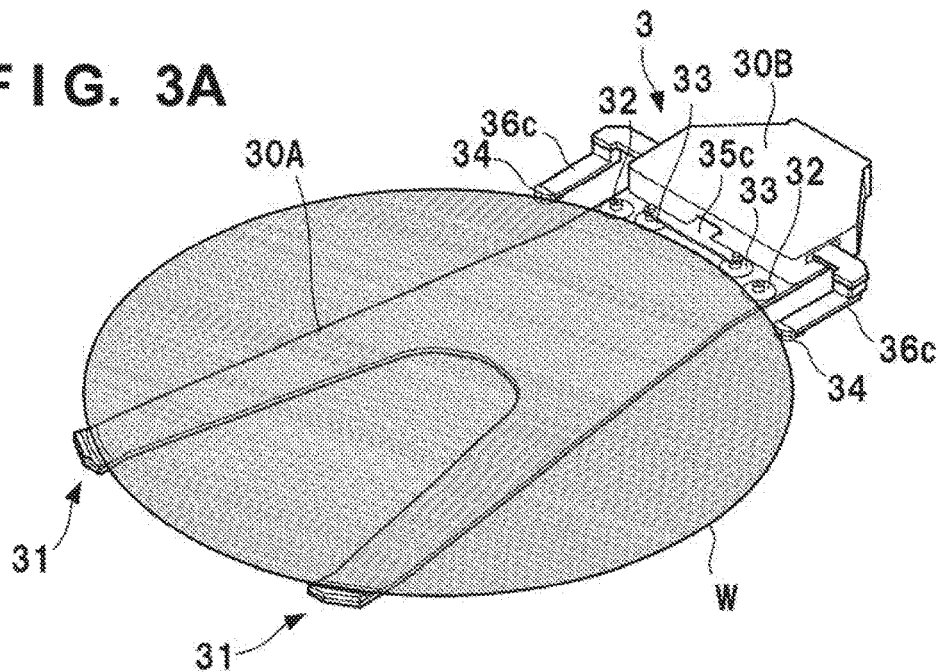
FIGS. 3A and 3B are perspective views each showing an example of the support state of a semiconductor wafer.
Figure 3B:
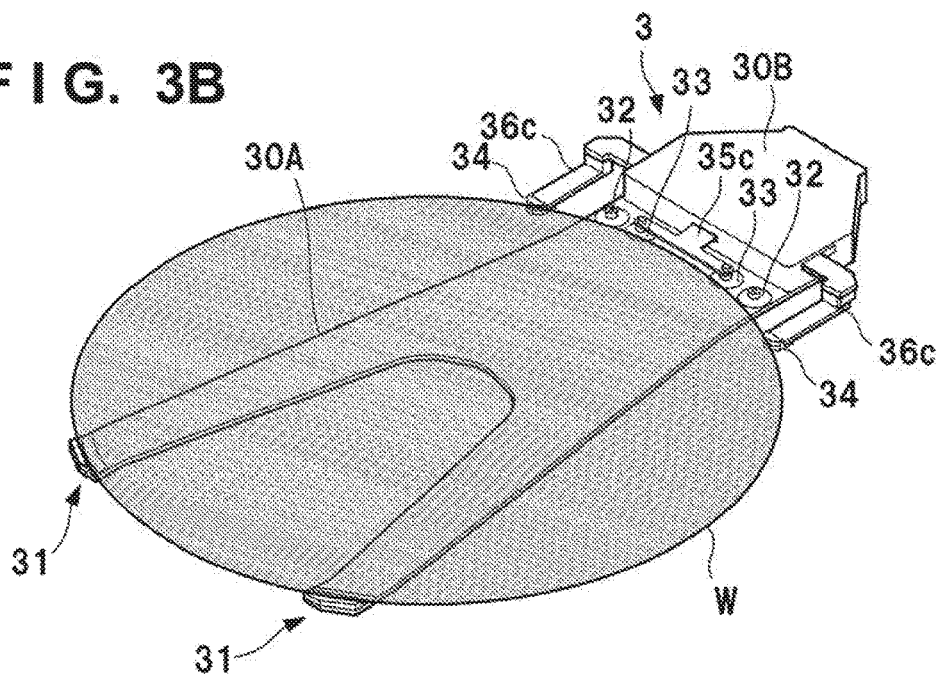

FIGS. 3A and 3B each show an example of the support state of a semiconductor wafer FIGS. 3A and 3B are perspective views each showing the semiconductor wafer W. FIG. 3A shows a state in which the combination of the support members 31 and 32 support the semiconductor wafer W. FIG. 3B shows a state in which the combination of the support members 31 and 33 support the semiconductor wafer W. The positions of the support members 33 and 34 are different between FIGS. 3A and 3B. In the example of FIG. 3A, the support members 33 are located on the side of the base unit 30B relative to the state shown in FIG. 3B. This position may be referred to as a retraction position. In the example of FIG. 3B, the support members 33 are located on the sides of the support members 31 relative to the state shown in FIG. 3. This position may be referred to as a forward movement position.

In this embodiment, it is possible to change the support position of the semiconductor wafer W by changing the positions of the support members 33. The support members 33 are relatively small parts among the components of the hand unit 3. The movement of the support members 33 requires no large driving force, that is, no actuator having a large output.

In the example of FIG. 3A, the holding members 34 are located on the side of the base unit 30B relative to the state shown in FIG. 3B. This position may be referred to as a backward movement position. The holding members 34 can be located closer to the base unit 30B. This position may be referred to as a retraction position. In the example of FIG. 3B, the holding members 34 are located on the sides of the support members 31 relative to the state shown in FIG. 3A. This position may be referred to as a forward movement position.

Figure 4A:
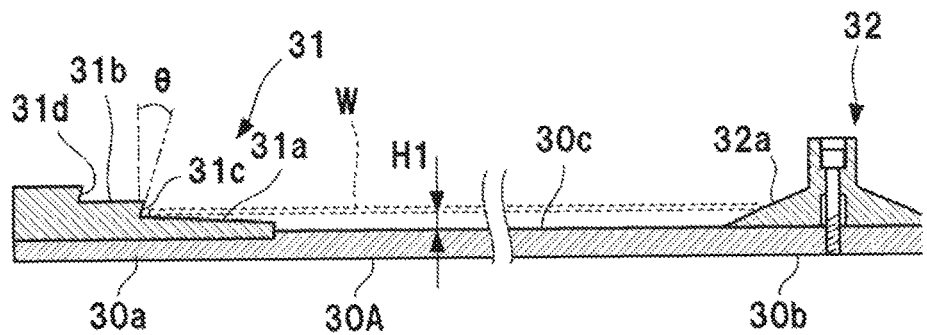
FIG. 4A is a sectional view taken along a line I-I in FIG. 2.
Figure 4B:
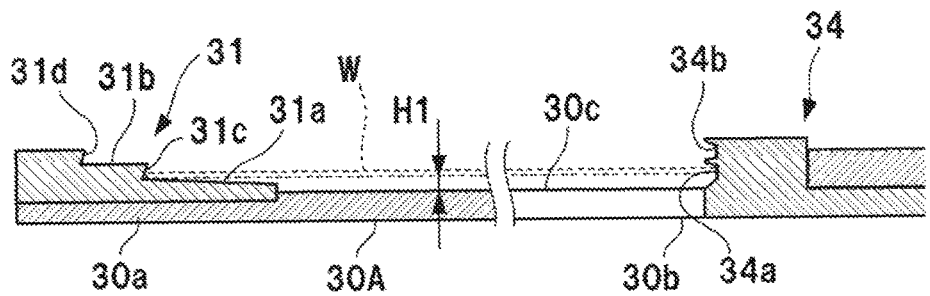
FIG. 4B is a sectional view taken along a line II-II in FIG. 2.

The support state by the combination of the support members 31 and 32 shown in FIG. 3A will be described. FIG. 4A is a sectional view taken along a line I-I in FIG. 2. FIG. 4B is a sectional view taken along a line II-II in FIG. 2. Note that in FIG. 2, the holding members 34 are located at the forward movement position. However, FIG. 4B is a sectional view when the holding members 34 are located at the backward movement position.

Each support member 31 includes support portions 31a and 31b having different support heights of the semiconductor wafer W with respect to the surface 30c of the hand member 30A. Although the support portions 31a and 31b may be formed as different members, two support portions 31a and 31b are formed in one support member 31 in this embodiment. In this embodiment, each of the support portions 31a and 31b serves as a placement surface for supporting the semiconductor wafer W from below, and the semiconductor wafer W is placed on the support portion 31a or 31b. The support portions 31a and 31b may be parallel to the surface 30c or slightly inclined. In this embodiment the support portion 31a is inclined slightly downward toward the root portion 30b. The support portion 31b may be inclined. When the support portions 31a or 31b are inclined, the contact area between the hand member 30A and the semiconductor wafer can be made smaller.

Each support portion 31a forms a surface for supporting the semiconductor wafer W at a support height H1 from the surface 30c, and the semiconductor wafer W is supported at the support height H1 by the combination of the support portions 31a and the support members 32. Each support member 32 includes a support portion 32a. The support portion 32a has a conical shape as a whole, and includes a placement surface (the inclined surface of a conical portion) for supporting the lower surface of the semiconductor wafer W. The support portion 32a may be formed to be parallel to the surface 30c or slightly inclined. However, by forming an inclined surface which is largely inclined like the support portion 32a in this embodiment, it becomes easy to support the semiconductor wafer W at different support heights, and the contact area between the support member 32 and the semiconductor wafer W can be made small.

Each support member 31 includes abutting surfaces 31c and 31d each for holding (clamping) the semiconductor wafer W in cooperation with the holding member 34. The abutting surfaces 31c and 31d may be formed as different members, and also formed as members different from the support portions 31a and 31b. In this embodiment, however, the two support portions 31a and 31b and the two abutting surfaces 31c and 31d are provided in each support member 31.

Each holding member 34 includes holding portions 34a and 34b each for holding the semiconductor wafer W. In this embodiment, each of the holding portions 34a and 34b is formed into a groove shape having an abutting surface which abuts against the edge of the semiconductor wafer W. The semiconductor wafer W is held to be sandwiched by the combination of the abutting surfaces 31c and holding portions 34a or the combination of the abutting surfaces 31d and holding portions 34b.

The abutting surfaces 31c and the holding portions 34a hold the semiconductor wafer W at the support height H1. Therefore, the abutting surfaces 31c and the holding portions 34a are at the same height with respect to the surface 30c. Each abutting surface 31c is continued to the edge of the support portion 31a on the side of the distal end portion 30a and is formed to stand upward from the support portion 31a. Each abutting surface 31c may be a vertical surface. In this embodiment, however, the abutting surface 31c is inclined toward the root portion 30b by an angle θ from the vertical surface. In other words, the abutting surface 31c is an upward inclined surface which is inclined from the support portion 31a to the root portion 30b. With this arrangement, a portion where the support portion 31a and the abutting surface 31c intersect each other forms a space with a wedge-shaped section. When sandwiching the semiconductor wafer W by the abutting surface 31c and the holding portion 34a, the semiconductor wafer W is fitted in the wedge-shaped space, thereby improving the holding force of the semiconductor wafer W.

Figure 4C:
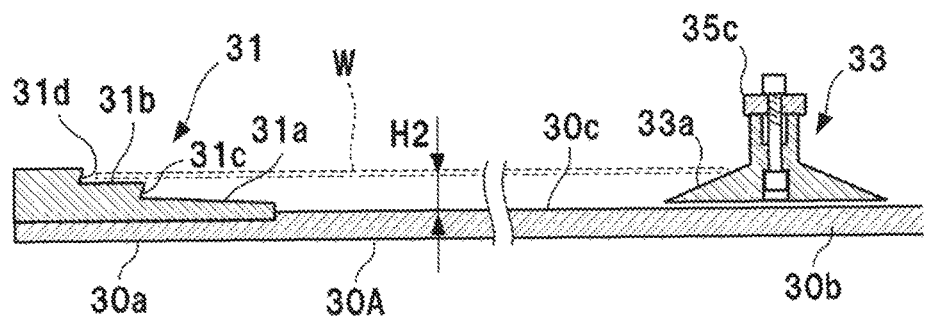
FIGS. 4C and 4D are sectional views for explaining a support height.
Figure 4D:
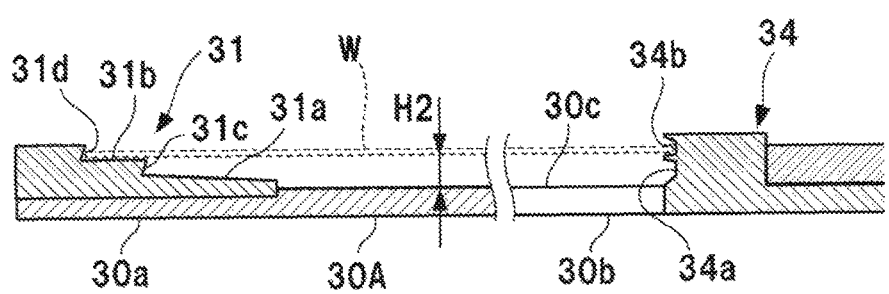

The support state by the combination of the support members 31 and the support members 33 shown in FIG. 3B will be described next. FIG. 4C is a sectional view taken along a line III-III in FIG. 2, in which the support members 33 are located at the forward movement position. FIG. 4D is a sectional view taken along the line II-II in FIG. 2, in which the holding members 34 are located at the forward movement position.

Each support portion 31b forms a surface for supporting the semiconductor wafer W at a support height H2 from the surface 30c, and the semiconductor wafer W is supported at the support height H2 by the combination of the support portions 31b and the support members 33. The support height H2 is higher than the support height H1. Each support portion 31b is located closer to the distal end portion 30a than the corresponding support portion 31a. Therefore, the support position of the semiconductor wafer W is different between the support states shown in FIGS. 3A and 3B in terms of not only the height but also the horizontal position. In the support state shown in FIG. 3B, the support position of the semiconductor wafer W is offset toward the distal end portion 30a, as compared with the support state shown in FIG. 3A.

Each support member 33 includes a support portion 33a. In this embodiment, the support members 32 are the same parts as the support members 33. Similarly to the support portion 32a, each support portion 33a includes a placement surface (the inclined surface of a conical portion) for supporting the lower surface of the semiconductor wafer W. The support members 32 may be parts different from the support members 33. However, using the same parts can reduce the types of parts.

The abutting surfaces 31d and the holding portions 34b hold the semiconductor wafer W at the support height H2. Therefore, the abutting surfaces 31d and the holding portions 34b are located at the same height with respect to the surface 30c. Each abutting surface 31d is continued, to the edge of the support portion 31b on the side of the distal end portion 30a and is formed to stand upward from the support portion 31b. Each abutting surface 31d may be a vertical surface. In this embodiment, however, the abutting surface 31d is inclined toward the root portion 30b from the vertical surface, similarly to the abutting surface 31c. In other words, the abutting surface 31d is an upward inclined surface which is inclined from the support portion 31b to the root portion 30b. With this arrangement a portion where the support portion 31b and the abutting surface 31d intersect each other forms a space with a wedge-shaped section. When sandwiching the semiconductor wafer W by the abutting surface 31d and the holding portion 34b, the semiconductor wafer W is fitted in the wedge-shaped space, thereby improving the holding force of the semiconductor wafer W.

<Transfer Example>

An example of transfer of the semiconductor wafer W by the transfer apparatus 1 will be described with reference to FIGS. 5 to 8. In this example, the operation of the hand unit 3 when extracting the semiconductor wafer W from a cassette (not shown), transferring the semiconductor wafer W to a cleaning apparatus (not shown), and then transferring the semiconductor wafer W from the cleaning apparatus to another cassette (not shown) will be described. As already described, during the transfer process, the orientation of the hand unit 3 variously changes. For the sake of descriptive convenience, the operation of the hand unit 3 in a state in which the longitudinal direction (distal end-front direction) of the hand unit 3 indicates the X direction and the width direction of the hand unit 3 indicates the Y direction will be described.

Figure 6:
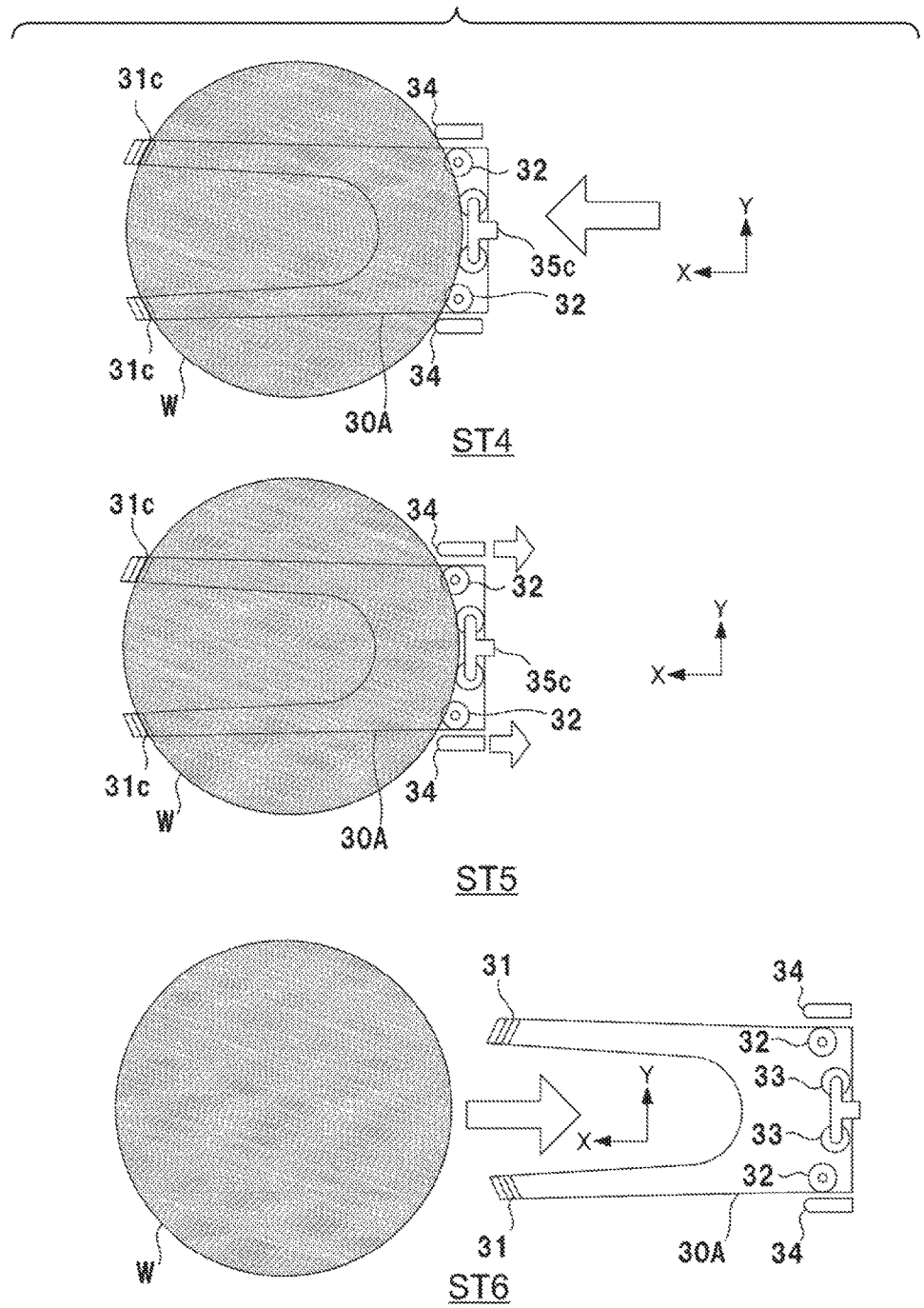
FIG. 6 is a view showing the example of the transfer operation.

States ST1 to ST6 shown in FIGS. 5 and 6 indicate steps of extracting the semiconductor wafer W from the cassette and transferring it to the cleaning apparatus. In this embodiment, the semiconductor wafer W is supported at the support height H1 before a cleaning process, and supported at the support height H2 after the cleaning process. This relationship may be reversed. However, the arrangement in which the semiconductor wafer W is supported at the higher support height H2 after the cleaning process is more preferable since dirt or the like adhering to the hand unit 3 from the semiconductor wafer W before the cleaning process is difficult to adhere to the semiconductor wafer W after the cleaning process.

First, the hand unit 3 is moved to the horizontal position and height to extract the semiconductor wafer. In the state ST1, an arrangement change process of changing the relative arrangement of the support portions 33a of the support members 32 and the support portions 33a of the support members 33 is performed. As described above, the semiconductor wafer W is supported at the support height H1 before the cleaning process, and thus the support members 31 and 32 support the semiconductor wafer W. Therefore, the driving unit 35 is driven to move the support members 33 to the retraction position, as indicated by an arrow in the state ST1. The holding members 34 are located at the retraction position.

In the state ST2, the transfer apparatus 1 moves the hand unit 3 so that the hand member 30A is located under the semiconductor wafer W. At this time, the hand unit 3 is moved to a position at which the support portions 31a and the peripheral portion of the semiconductor wafer W overlap each other in the vertical direction. Subsequently, the transfer apparatus 1 raises the hand unit 3 to lift up the semiconductor wafer w from the placement portion of the cassette, and the semiconductor wafer W is transferred from the cassette to the hand unit 3. At this time, the semiconductor wafer W is placed on the support portions 31a and 32a at the support height H1 in the horizontal orientation.

In the state ST3, the driving unit 36 is driven to move the holding members 34 to the backward movement position. This horizontally moves the semiconductor wafer W on the support portions 31a toward the abutting surfaces 31c, and the semiconductor wafer W is finally held to be sandwiched between the abutting surfaces 31c and the holding portions 34a of the holding members 34, thereby enabling high-speed transfer of the semiconductor wafer W and a reversing operation (an operation of reversing the semiconductor wafer W by reversing the hand unit 3).

Subsequently, the transfer apparatus 1 transfers the semiconductor wafer W to the cleaning apparatus. The state ST4 indicates a state in which the semiconductor wafer W is transferred to a position above the placement portion of the cleaning apparatus. In the state ST5, the driving unit 36 is driven to move the holding members 34 to the retraction position. This releases holding of the semiconductor wafer W. Then, the transfer apparatus 1 lowers the hand unit 3 to transfer the semiconductor wafer W from the hand unit 3 to the cleaning apparatus, and the semiconductor wafer W is placed on the placement portion of the cleaning apparatus. After that, as shown in the state ST6, the transfer apparatus 1 moves the hand unit 3 in a direction indicated by an arrow, and the head unit 3 is retracted from the cleaning apparatus. This completes transfer of the semi-conductor wafer W from the cassette to the cleaning apparatus.

When cleaning of the semiconductor wafer W ends, the semiconductor wafer w is transferred from the cleaning apparatus to the cassette. States ST 7 to ST12 shown in FIGS. 7 and 8 indicate steps of extracting the semiconductor wafer W from the cleaning apparatus and transferring it to the cassette.

The hand unit 3 is moved to the horizontal position, and height to extract the semiconductor wafer W. In the state ST7, an arrangement change process of changing the relative arrangement of the support portions 32a of the support members 32 and the support portions 33a of the support members 33 is performed. As described above, the semiconductor wafer W is supported at the support height H2 after the cleaning process, and thus the support members 31 and 33 support the semiconductor wafer W. Therefore, the driving unit 35 is driven to move the support members 33 to the forward movement position, as indicated by an arrow in the state ST7. The holding members 34 are located at the retraction position.

In the state ST8, the transfer apparatus 1 moves the hand unit 3 so that the hand member 30A is located under the semiconductor wafer W. At this time, the hand unit 3 is moved to a position at which the support portions 31b and the peripheral portion of the semiconductor wafer W overlap each other in the vertical direction. Subsequently, the transfer apparatus 1 raises the hand unit 3 to lift up the semiconductor wafer W from the placement portion of the cleaning apparatus, and the semiconductor wafer W is transferred from the cleaning apparatus to the hand unit 3. At this time, the semiconductor wafer W is placed on the support portions 31b and 33a at the support height H2 in the horizontal orientation.

In the state ST9, the driving unit 36 is driven to move the holding members 34 to the forward movement position. This horizontally moves the semiconductor wafer W on the support portions 31b toward the abutting surfaces 31d, and the semiconductor wafer W is finally held to be sandwiched between the abutting surfaces 31d and the holding portions 34b of the holding members 34, thereby enabling high-speed transfer of the semiconductor wafer W and a reversing operation.

Subsequently, the transfer apparatus 1 transfers the semiconductor wafer W to the cassette. The state ST10 indicates a state in which the semiconductor wafer W is transferred to a position above the placement portion of the cassette. In the state ST11, the driving unit 36 is driven to move the holding meters 34 to the retraction position. This releases holding of the semiconductor wafer W. Then, the transfer apparatus 1 lowers the hand unit 3 to transfer the semiconductor wafer W from the hand unit 3 to the cassette, thereby placing the semiconductor wafer W on the placement portion of the cassette. After that, as shown in the state ST12, the transfer apparatus 1 moves the hand unit 3 in a direction indicated by an arrow, and the hand unit 3 is retracted from the cassette. This completes transfer of the semiconductor wafer W from the cleaning apparatus to the cassette. The process advances by repeating the same procedure.

As described above, with the hand unit 3 according to this embodiment, it is possible to change the support position of the semiconductor wafer W, for example, before and after the cleaning process while using the one hand unit 3. This prevents dirt from adhering to the semiconductor wafer W when transferring again, to the hand unit 3, the semiconductor wafer W after the cleaning process, even if there is dirt adhering to the hand unit 3 from the semiconductor wafer W before the cleaning process.

Since the hand unit 3 according to this embodiment transfers the semiconductor wafer W in the horizontal orientation, no particles are generated due to the inclination of the semiconductor wafer W at the time of transfer.

On the other hand, in the semiconductor manufacturing steps, the semiconductor wafer W on the hand unit 3 may be reversed by rotating the hand unit 3 about the horizontal axis during transfer of the semiconductor wafer W by the transfer apparatus 1. At this time, if a hand unit which contacts and supports the edge of a semiconductor wafer is used, the semiconductor wafer falls when the hand unit is rotated.

To the contrary, if the hand unit 3 according to this embodiment is used, when sandwiching the semiconductor wafer W by the abutting surfaces 31c and the holding portions 34a (or the abutting surfaces 31d and the holding portions 34b), the edge of the upper surface of the semiconductor wafer W on the sides of the abutting surfaces 31c (or abutting surfaces 31d) is fitted in the wedge-shaped spaces. Then, the edge of the upper surface of the semiconductor wafer W on the sides of the abetting surfaces 31c (or abutting surfaces 31d) is biased against the surface 30c of the hand member 30A by the spaces. Since the semiconductor wafer W is sandwiched by the hand unit 3 in this state, even if the hand unit 3 is reversed, the semiconductor wafer W never falls from the hand unit 3.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2016-071015, filed Mar. 31, 2016, which is hereby incorporated by reference herein in its entirety.

What is claimed is:

1. A hand unit of a robot arm including a U-shaped placement portion on which a semiconductor wafer is placed, comprising:
   a first support portion and a second support portion on one end side of the placement portion, the first support portion being configured to support the semiconductor wafer at a first support height, and the second support portion being configured to support the semiconductor wafer at a second support height; and
   a third support portion and a fourth support portion on an other end side of the placement portion, the third support portion being configured to support the semiconductor wafer at the first support height, and the fourth support portion being configured to support the semiconductor wafer at the second support height,
   wherein the hand unit further comprises a first driving unit configured to move the third support portion and/or the fourth support portion forward and backward with respect to the first support portion and the second support portion,
   each of the first support portion and the second support portion includes a placement surface which supports a lower surface of the semiconductor wafer and an abutting surface which abuts against an edge of the semiconductor wafer, and
   each of the third support portion and the fourth support portion includes an inclined placement surface which supports the lower surface of the semiconductor wafer.

2. The unit according to claim 1, further comprising:
   a first holding portion and a second holding portion on the other end side, the first holding portion being configured to hold the semiconductor wafer at the first support height, and the second holding portion being configured to hold the semiconductor wafer at the second support height.

3. The unit according to claim 2, further comprising:
   a second driving unit configured to move the first holding portion and the second holding portion forward and backward with respect to the first support portion and the second support portion.

4. The unit according to claim 1, wherein the abutting surface is an inclined surface which is continued to the one end side of the placement surface and inclined upward toward the other end side.

5. A hand unit of a robot arm for transferring a semiconductor wafer, comprising:
   a flat U-shaped hand member;
   a first support member provided on a distal end side of the hand member;
   a second support member provided on a root side of the hand member;
   a third support member provided on the root side of the hand member; and
   a first driving unit,
   the first support member including a first support portion configured to support the semiconductor wafer at a first support height from a surface of the hand member, and a second support portion configured to support the semiconductor wafer at a second support height from the surface,
   the second support member including a third support portion configured to support the semiconductor wafer at the first support height from the surface, and
   the third support member including a fourth support portion configured to support the semiconductor wafer at the second support height from the surface,
   wherein the first driving unit moves the second support member and/or the third support member forward and backward with respect to the first support member,
   each of the first support portion and the second support portion includes a placement surface which supports a lower surface of the semiconductor wafer and an abutting surface which abuts against an edge of the semiconductor wafer, and
   each of the third support portion and the fourth support portion includes an inclined placement surface which supports the lower surface of the semiconductor wafer.

6. The unit according to claim 5, further comprising:
   a holding member provided on the root side,
   the holding member including a first holding portion configured to hold the semiconductor wafer at the first support height from the surface, and a second holding portion configured to hold the semiconductor wafer at the second support height from the surface.

7. The unit according to claim 6, further comprising:
   a second driving unit configured to move the holding member forward and backward with respect to the first support member.

8. A transfer method of transferring a semiconductor wafer by a hand unit of a robot arm including a U-shaped placement portion on which the semiconductor wafer is placed,
   the hand unit including
   a first support portion and a second support portion which are arranged on one end side of the placement portion, the first support portion being configured to support the semiconductor wafer at a first support height, and the second support portion being configured to support the semiconductor wafer at a second support height, and
   a third support portion and a fourth support portion each arranged on an other end side of the placement portion and configured to support the semiconductor wafer, the method comprising:
a first transferring step of transferring the semiconductor wafer before a process; and
a second transferring step of transferring the semiconductor wafer after the process,
the first transferring step including
a first moving step of moving one of the third support portion or the fourth support portion, and
a first supporting step of supporting the semiconductor wafer at the first support height by the first support portion and the other one of the third support portion or the fourth support portion,
the second transferring step including
a second moving step of moving the one of the third support portion or the fourth support portion, and
a second supporting step of supporting the semiconductor wafer at the second support height by the second support portion and the one of the third support portion or the fourth support portion,
wherein the second support height is a height offset upward in a vertical direction with respect to the first support height.

9. The method according to claim 8, wherein
in the first transferring step, the semiconductor wafer before the process is supported at a first horizontal position on the placement portion,
in the second transferring step, the semiconductor wafer after the process is supported at a second horizontal position on the placement portion, which is offset to the one end side with respect to the first horizontal position,
in the first moving step, the other one of the third support portion or the fourth support portion is located at a position corresponding to the first horizontal position, and
in the second moving step, the one of the third support portion or the fourth support portion is located at a position corresponding to the second horizontal position.

10. The method according to claim 8, wherein
the hand unit further includes
a first holding portion arranged on the other end side of the placement portion and configured to hold the semiconductor wafer at the first support height, and
a second holding portion arranged on the other end side of the placement portion and configured to hold the semiconductor wafer at the second support height,
the first transferring step includes a first sandwiching step of sandwiching, by the first support portion and the first holding portion, the semiconductor wafer supported at the first support height by the first support portion and one of the third support portion or the fourth support portion by advancing the first holding unit toward the first support portion, and
the second transferring step includes a second sandwiching step of sandwiching, by the second support portion and the second holding portion, the semiconductor wafer supported at the second support height by the second support portion and the other one of the third support portion or the fourth support portion by advancing the second holding portion toward the second support portion.

11. A transfer method of transferring a semiconductor wafer by a hand unit of a robot arm including a U-shaped placement portion on which the semiconductor wafer is placed,
the hand unit including
a first support portion and a second support portion which are arranged on one end side of the placement portion, the first support portion being configured to support the semiconductor wafer at a first support height, and the second support portion being configured to support the semiconductor wafer at a second support height, and
a third support portion and a fourth support portion each arranged on an other end side of the placement portion and configured to support the semiconductor wafer,
the method comprising:
a first transferring step of transferring the semiconductor wafer before a process; and
a second transferring step of transferring the semiconductor wafer after the process,
the first transferring step including
a first arrangement change step of changing relative arrangement of the third support portion and the fourth support portion, and
a first supporting step of supporting the semiconductor wafer at the first support height by the first support portion and the third support portion,
the second transferring step including
a second arrangement change step of changing relative arrangement of the third support portion and the fourth support portion, and
a second supporting step of supporting the semiconductor wafer at the second support height by the second support portion and the fourth support portion,
wherein the second support height is a height offset upward in a vertical direction with respect to the first support height.

12. The method according to claim 11, wherein
the hand unit further includes
a first holding portion arranged on the other end side of the placement portion and configured to hold the semiconductor wafer at the first support height, and
a second holding portion arranged on the other end side of the placement portion and configured to hold the semiconductor wafer at the second support height,
the first transferring step includes a first sandwiching step of sandwiching, by the first support portion and the first holding portion, the semiconductor wafer supported at the first support height by the first support portion and one of the third support portion or the fourth support portion by advancing the first holding unit toward the first support portion, and
the second transferring step includes a second sandwiching step of sandwiching, by the second support portion and the second holding portion, the semiconductor wafer supported at the second support height by the second support portion and the other one of the third support portion or the fourth support portion by advancing the second holding portion toward the second support portion.

* * * * *